United States Patent [19]
Kaufmann et al.

[11] Patent Number: 5,999,717
[45] Date of Patent: Dec. 7, 1999

[54] METHOD FOR PERFORMING MODEL CHECKING IN INTEGRATED CIRCUIT DESIGN

[75] Inventors: Matthew J. Kaufmann; Andrew Martin; Carl Pixley, all of Austin, Tex.

[73] Assignee: Motorola, Inc., Schaumburg, Ill.

[21] Appl. No.: 09/001,751

[22] Filed: Dec. 31, 1997

[51] Int. Cl.$^6$ .................................................. G06F 17/50
[52] U.S. Cl. ................................. 395/500.23; 395/500.06
[58] Field of Search ................................ 395/500, 500.23, 395/500.06; 364/578, 488–491

[56] References Cited

U.S. PATENT DOCUMENTS

| | | | |
|---|---|---|---|
| 5,696,771 | 12/1997 | Beausang et al. | 395/500.07 |
| 5,751,593 | 5/1998 | Pullela et al. | 395/500.07 |
| 5,790,415 | 8/1998 | Pullela et al. | 395/500.07 |

OTHER PUBLICATIONS

David E. Long, "Model Checking, Abstraction, and Compositional Verification", Thesis for the degree of Doctor of Philosophy, School of Computer Science, Pittsburgh, PA, Jul. 1993, (12pp.), Chapter 2 "Compositional Verification Part I", pp.21–58, Chapter 3 "Compositional Verification Part II", pp. 59–90.

Edmund M. Clarke et al., "Design and Synthesis of Synchronization Skeletons Using Branching Time Temporal Logic", Aiken Computation Laboratory, Harvard University, Cambridge, Mass., 20 pp.

*Primary Examiner*—Kevin J. Teska
*Assistant Examiner*—Russell W. Frejd
*Attorney, Agent, or Firm*—Daniel D. Hill

[57] ABSTRACT

A method is presented for performing model checking of an integrated circuit design that avoids the need for construction of an environment model by the use of constraints (44). The method supports an assume/guarantee style of reasoning to ensure that the constraints (44) are a true abstraction of the actual environment in which the integrated circuit is designed to operate. The constraints (44) may be used to provide primary inputs for a design under analysis (DUA) (16). Also, the constraints (44) may refer to internal states and to outputs of the DUA (16). In addition, monitors (42) may be used to monitor the inputs to the DUA (16). The constraints (44) can then be used with the monitors (42) to specify complex sequential environment properties.

16 Claims, 6 Drawing Sheets

METHOD FOR PERFORMING MODEL CHECKING IN INTEGRATED CIRCUIT DESIGN

FIELD OF THE INVENTION

The present invention relates generally to model checking, and more specifically to model checking in integrated circuit design.

BACKGROUND OF THE INVENTION

Figure 1:
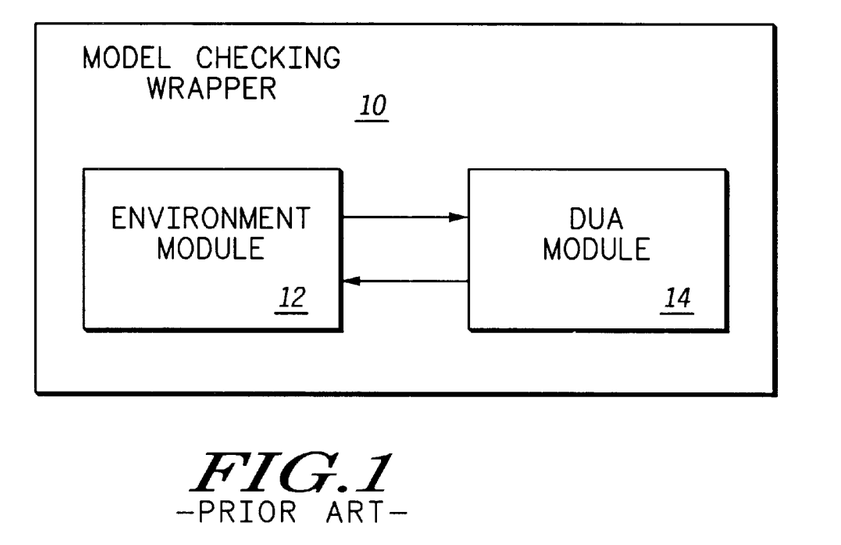
FIG. 1 illustrates, in block diagram form, a model checking wrapper in accordance with the prior art.

Symbolic model checking is commonly used to check, or verify, an integrated circuit design before the integrated circuit design is implemented in a semiconductor device. In symbolic model checking, a model of an environment in which the semiconductor device is intended to function is constructed. FIG. 1 illustrates, in block diagram form, a prior art model checking wrapper 10 that includes an environment module 12 that is bi-directionally coupled to a design under analysis (DUA) module 14. The environment model is separate from the DUA, and includes environmental constraints that control the input signals provided to the integrated circuit design during model checking.

In some digital circuit designs, it may be possible to simply provide every combination of input bits to the DUA model and observe the outputs. However, many circuits are designed to work correctly only under certain specific environmental constraints, or assumptions. The environmental assumptions are used to simulate, as closely as possible, the actual input signals which would be received by the integrated circuit in its intended application. However, constructing the environment model is difficult, time-consuming and potentially error-prone for large complex circuits and systems. Also, there exists no clear methodology for ensuring that the environment model is a true abstraction of the actual environment in which the integrated circuit is designed to operate.

BRIEF DESCRIPTION OF THE DRAWINGS

The present invention is illustrated by way of example and not limited in the accompanying figures, in which like references indicate similar elements, and in which.

DETAILED DESCRIPTION OF THE DRAWINGS

Generally, the present invention provides a method for performing symbolic model-checking of a finite state system, such as an integrated circuit design, that avoids the need for construction of an environment model by using constraints. The method supports an assume/guarantee style of reasoning to ensure that the constraints are a true abstraction of the actual environment in which the integrated circuit is designed to operate. The method uses monitors and constraints, implemented, or enclosed, within a model checker, to provide a relatively simple way to model environments. In addition to constraining primary inputs, the constraints may refer to internal states and to outputs of the design under analysis. Monitors monitor signals of the DUA, and may record a history of the signals. Because the constraints can refer to the internal state of a design or monitor, the constraints can also be used with the monitors to specify complex sequential environment properties.

This use of constraints provides the advantage of being easier to write than environment models. Also, the constraints can be verified using the assume/guarantee method.

There are generally three levels of constraints: (1) constraints that refer to primary inputs only; (2) constraints that relate inputs to the state of the outputs; and (3) constraints that are sequential and depend on the state of the monitors.

Figure 2:
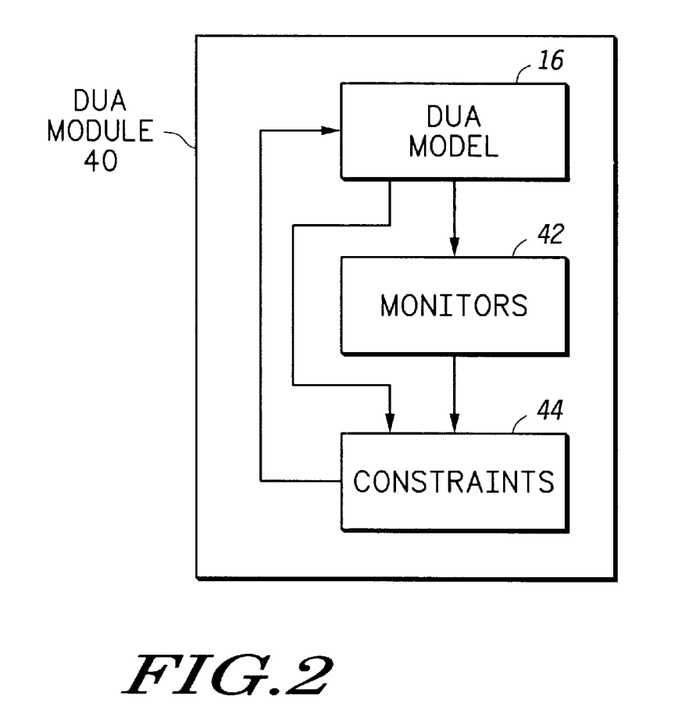
FIG. 2 illustrates, in block diagram form, a DUA module in accordance with the present invention.

FIG. 2 illustrates, in block diagram form, a DUA module 40 in accordance with an embodiment of the present invention. DUA module 40 includes a DUA model 16, monitors 42 and constraints 44. DUA model 16 is a software program model of a sequential design. Note that the lines between the blocks of FIG. 2 indicate information flow. A sequential design may be, for example, a digital, synchronous, integrated circuit design. Constraints 44 receive inputs from DUA model 16 and monitors 42, and the constraints restrict the inputs to DUA model 16. FIG. 2 illustrates that constraints 44 are implemented as expressions involving signals of the DUA model 16 and the monitors 42. Thus, the requirement for an environment to be constructed, as was done in the prior art, is eliminated.

Monitors 42 are implemented as state machines and record information about inputs and other selected signals from DUA model 16. Monitors 42 may be used to record a history of inputs or internal states of the DUA model 16. Constraints 44 use the information from monitors 42 and from DUA model 16 to determine next valid inputs to DUA model 16. Monitors 42 may be useful in models that require preceding input patterns to be used in formulating a future input for DUA model 16. In some applications the use of monitors 42 may not be necessary. For example, monitors 42 may not be necessary in applications where the constraints depend only on the state of the design under verification. Also, monitors 42 may not be necessary when the constraints involve only the inputs to the design under verification. In these cases, the use of monitors 42 would therefore be optional.

A designer has the option of performing model checking of a finite state system, such as for example, an integrated circuit design in accordance with the present invention with or without using reachability analysis.

Figure 3:
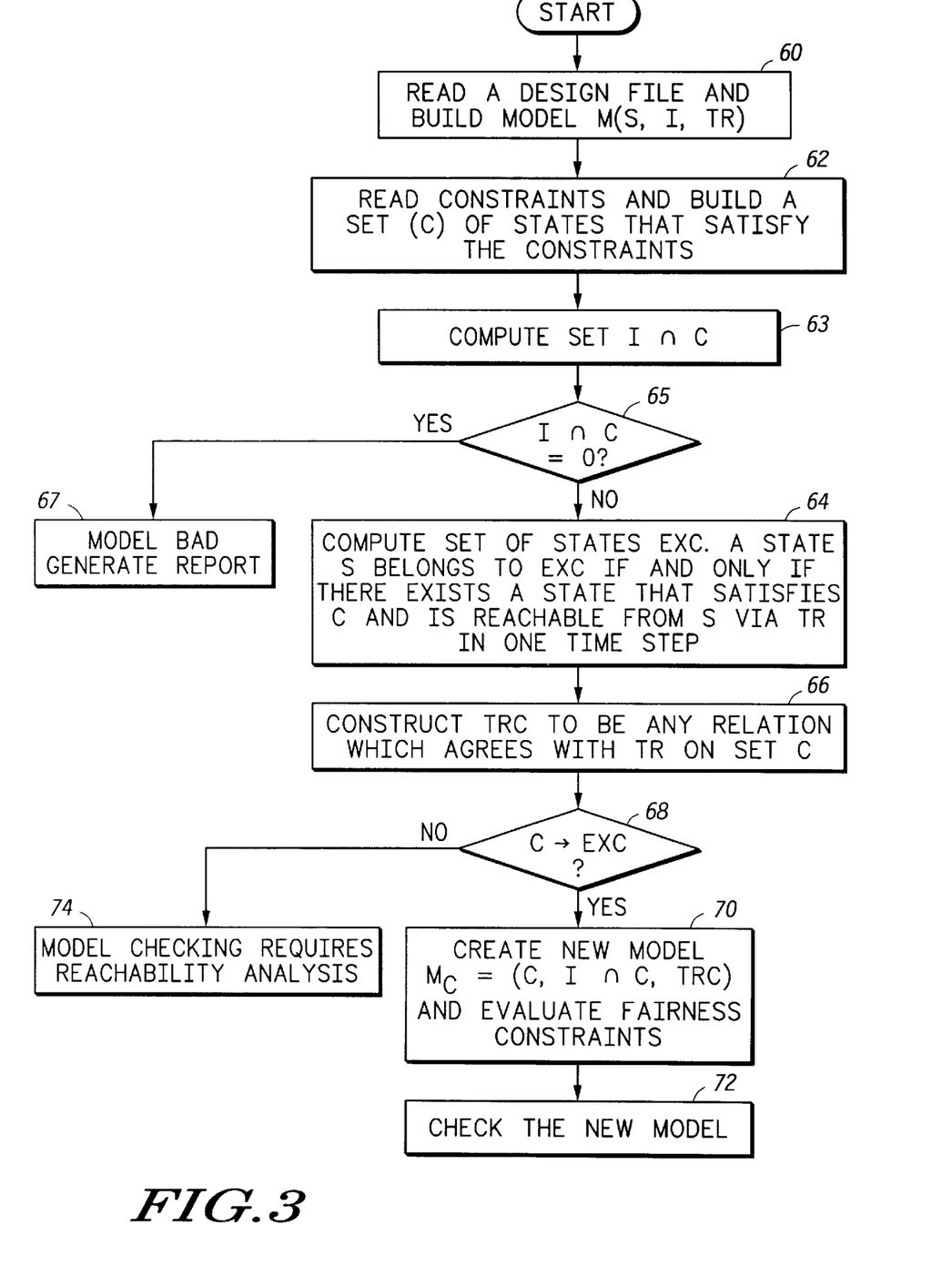
FIG. 3 illustrates a flow diagram of a method in accordance with the present invention which does not use reachability analysis.

FIG. 3 illustrates a flow diagram of a method for model checking in accordance with the present invention which excludes the use of reachability analysis. To save time, a designer may first decide to attempt model checking without reachability analysis. Model checking using reachability analysis is discussed later in connection with FIGS. 6 and 7.

Referring to FIG. 3, at step 60, a model is built using a design file for a finite state system with any type of design language, for example Verilog, DSL, or VHDL. The model, labeled "M", includes a state space labeled "S", an initial set of states labeled "I", and a transition relation labeled "TR". The state space S consists of all assignments of ones and zeros (Boolean valued expression) to inputs and to latch outputs of the circuit being modeled. Note that in the illustrated embodiment, the sets discussed herein are constructed using binary decision diagrams. However, one of ordinary skill in the art would recognize that the sets could be constructed using any of the methods of either explicit state enumeration or implicit state representation. At step 62, a set of states, labeled "C", is built that satisfy user-defined constraints. Note that for purposes of describing the present invention, "C" may be used to represent a set, or as an expression that defines the set. At step 63, a set I intersect C, that is, (I∩C) is computed. At decision step 65, it is determined if the set (I∩C) is equal to zero, or the empty set. If I∩C=0, the YES path is taken to step 67. At step 67, a report is generated indicating that the model is bad. If set (I∩C) is not equal to zero, the NO path is taken to step 64. At step 64, a set of states labeled "EXC" is computed. A state of set S belongs to set EXC if and only if there exists a state that satisfies C and is reachable from within set S via TR in one time step. Note that "one time step" is intended to mean one step in a sequence of events, and may not refer only to time. At step 66, a new transition relation labeled "TRC" is constructed. The transition relation TRC is any relation which agrees with TR on set C. The transition relation TRC includes members of TR whose coordinates lie within set C. At decision step 68, it is determined if the temporal logic expression (C implies EXC) is true or if it fails. If C does not imply EXC (i.e. the expression fails), then the NO path is taken to step 74. Note that examples for illustrating when the expression (C implies EXC) is true or fails are provided in FIGS. 4 and 5. At step 74, an error condition is reported. Notwithstanding this failure, it may still be possible to perform model checking using the method of FIG. 6, which will be discussed later. Referring back to FIG. 3, if at decision step 68 the temporal logic expression (C implies EXC) is true, the YES path is taken to step 70. At step 70, a new model is created labeled "MC". The new model includes set C, the intersection of set I with set C, and TRC, i.e. MC=(C, I∩C, TRC). Also, at step 70, fairness constraints may be evaluated using the new model MC. At step 72, the new model MC is checked using temporal logic formulas, such as for example, computation tree logic (CTL), to determine if the model satisfies a predefined specification.

Figure 4:
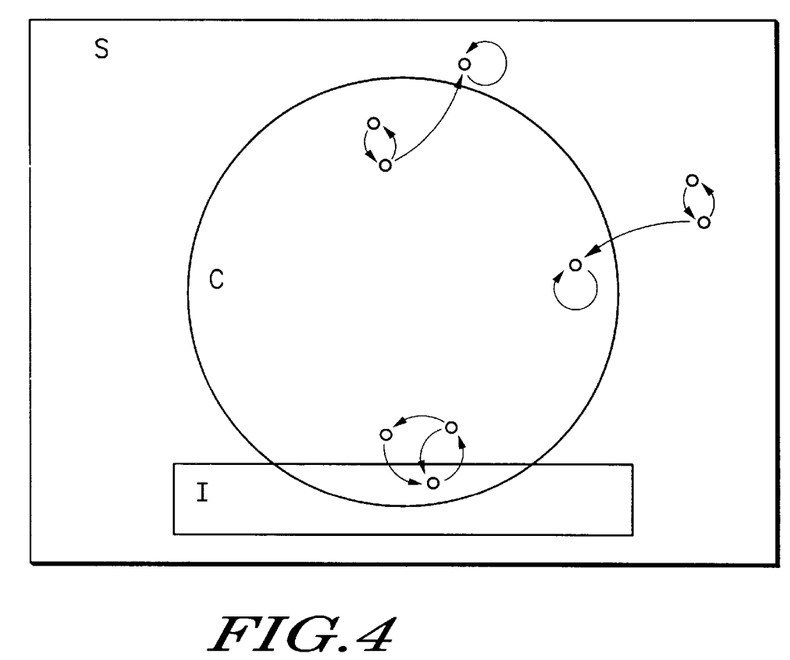
FIG. 4 illustrates, in partial Venn diagram form and partial state diagram form, an example in which the temporal logic expression (C implies EXC) is true.
Figure 5:
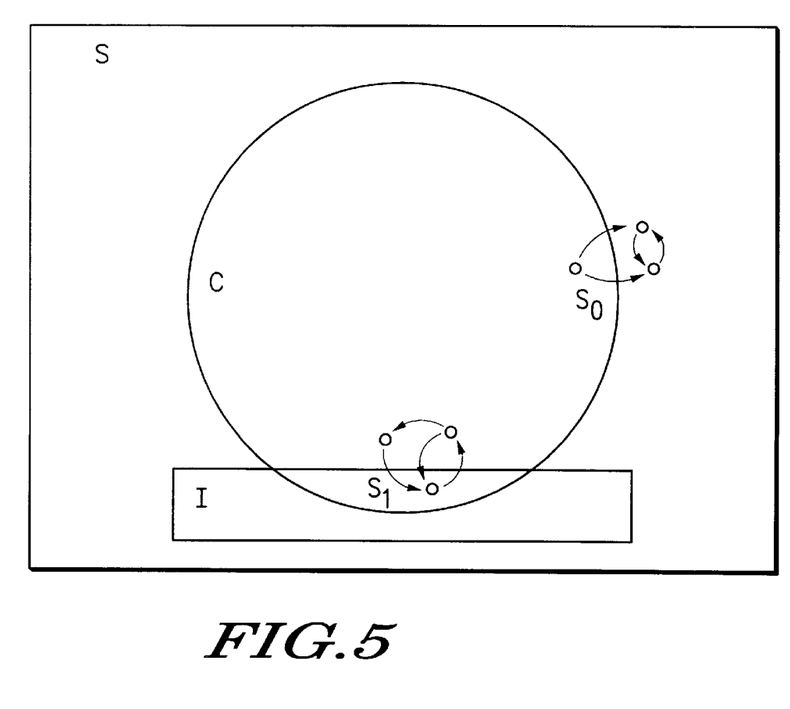
FIG. 5 illustrates, in partial Venn diagram form and partial state diagram form, an example in which the expression (C implies EXC) fails.

FIG. 4 illustrates, in partial Venn diagram form and partial state diagram form, an example in which the temporal logic expression (C implies EXC) from step 68 of the method of FIG. 3 is true. In FIGS. 4 and 5, a rectangle labeled "S" represents the set of states of a design under verification. A circle labeled "C" is a subset of set S and represents the set of states satisfying all of the constraints C. The dots represent several states and the curved arrows between the dots represent one step transitions. A rectangle labeled "I" represents the set I and indicates a set of states within set S that are the initial states. Note that the set shapes in FIGS. 4 and 5 are for illustration purposes only and are not intended to reflect any property of the sets.

FIG. 4 is used to illustrate that the temporal logic expression (C implies EXC) is true because every state within set C may transition to another state within set C in one time step. Therefore, the temporal expression (C implies EXC) holds. FIG. 4 also illustrates that whether states outside of set C transition to set C or not, is irrelevant to whether the expression (C implies EXC) holds. Therefore, model checking without reachability analysis can be accomplished on the integrated circuit design under verification.

FIG. 5 illustrates, in partial Venn diagram form and partial state diagram form, an example in which the temporal logic expression (C implies EXC) from step 68 of the method of FIG. 3 fails. In FIG. 5, a state labeled "S0" is provided to illustrate a case in which every transition from state S0 goes to a state outside of set C in one time step. Therefore, the expression (C implies EXC) fails because for state S0, the expression C holds, but the expression EXC fails. Nevertheless, the example illustrated in FIG. 5 is still model checkable because state S0 is not reachable from any initial state, for example, the initial state labeled "S1". Note that the example illustrated in FIG. 5 may still be model checked using the method illustrated in FIG. 6 below.

Figure 6:
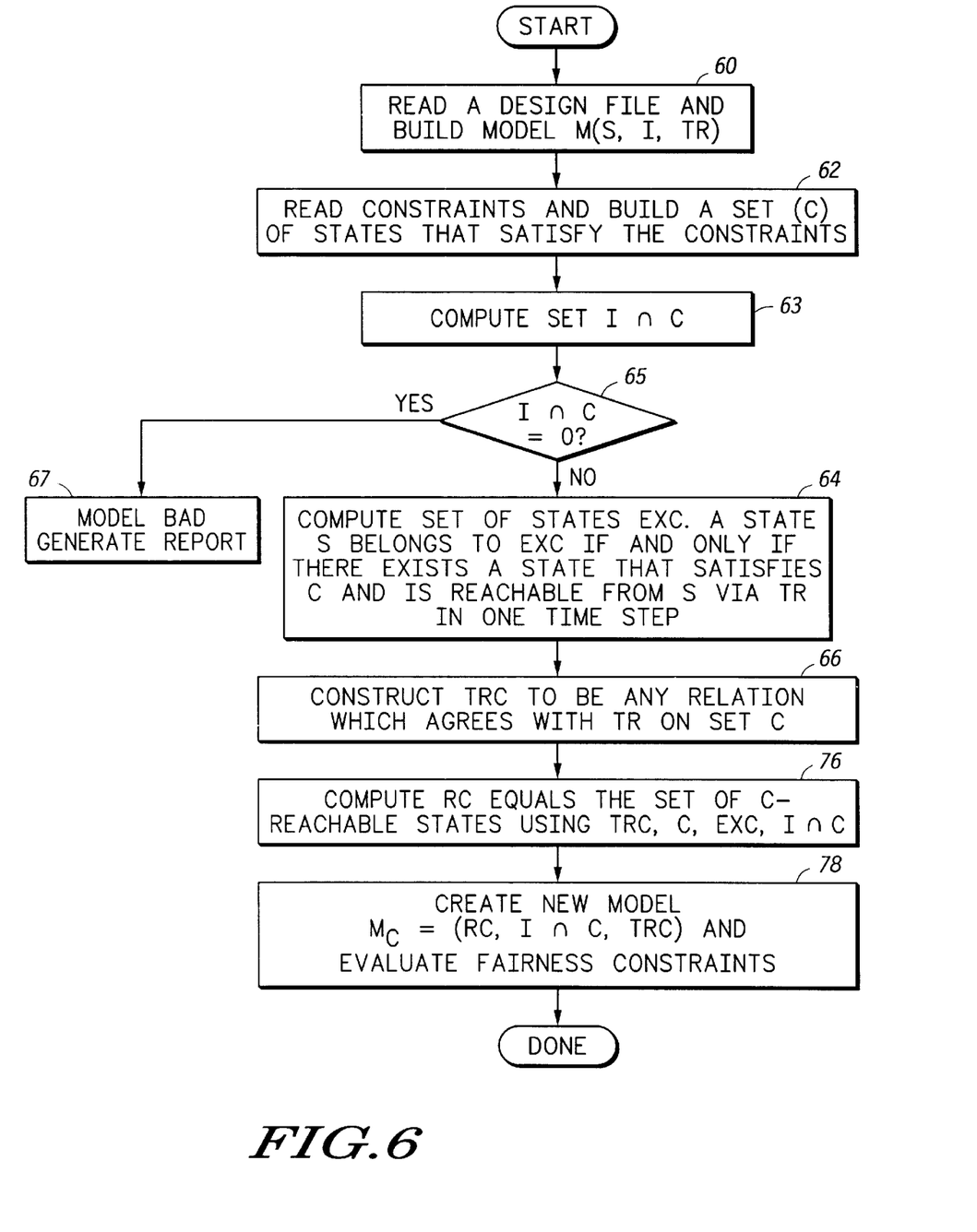
FIG. 6 illustrates a flow diagram of a method for model checking in accordance with the present invention which uses reachability analysis.

FIG. 6 illustrates a method for model checking in accordance with the present invention which uses reachability analysis. Note that steps 60, 62, 63, 64, 65, 66, and 67 are the same as the steps having the same reference numbers in FIG. 3, and will not be discussed further in the discussion of FIG. 6. At step 76, a set labeled "RC" is determined. The set RC is defined as a set of states in set C that are reachable from the set (I∩C) using the transition relation TRC, set C, set EXC, and (I∩C). Note however, that if a state in RC does not have at least one successor state that is in EXC, then the model is bad, an error report is generated, and flow does not continue to step 78. Step 76 is discussed in more detail in the discussion of FIG. 7. After set RC is determined, at step 78, a new model is created labeled "MC" where MC includes RC, (I∩C), and transition relation TRC. Also, in step 78, fairness constraints are evaluated.

Figure 7:
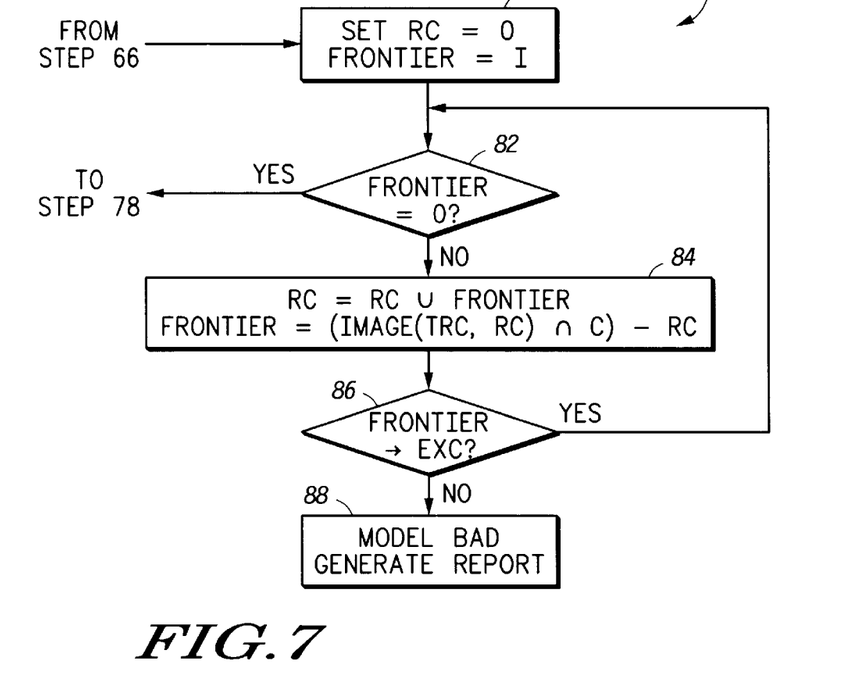
FIG. 7 illustrates the step of computing RC of FIG. 6 in more detail.

FIG. 7 illustrates step 76 of FIG. 6 in more detail. At step 80, the set RC is set to be equal to the empty set, or zero. A frontier set labeled "F" is set equal to the set (I∩C). At decision step 82, it is determined if the frontier set F is equal to the empty set. If the frontier set is equal to the empty set, the YES path is taken to step 78 where a new model is created labeled "MC" and additional model checking may be conducted. If the frontier set F is not equal to zero, the NO path is taken to step 84. At step 84, the set RC is updated to equal the current value of RC union the current frontier F. Then the frontier is recomputed. The new frontier F=(image (TRC, RC)∩C)–RC, where image(TRC, RC) represents a set of states in S that are reachable in one time step from RC using the transition relate TRC.

At decision step 86, it is determined if the frontier F is a subset of EXC. If the frontier is not a subset of EXC, the NO path is taken to step 88. At step 88, the model is bad, and an error condition report is generated. An example of this condition is provided in FIG. 8.

Figure 8:
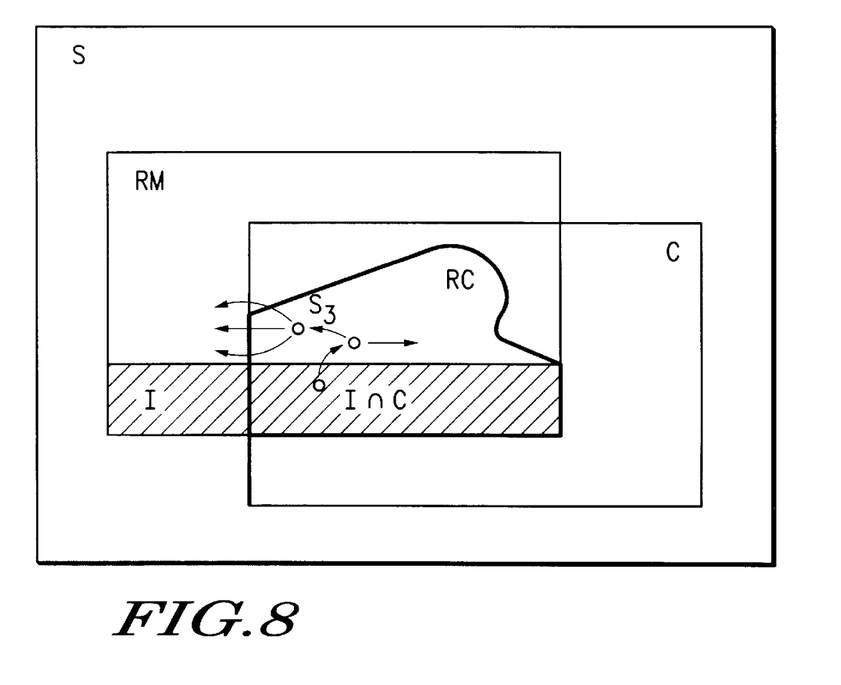
FIG. 8 illustrates, in partial Venn diagram form and partial state diagram form, an example of a model that is not model checkable.

FIG. 8 illustrates, in partial Venn diagram form and partial state diagram form, an example of a model that is not model checkable using the method of FIGS. 6 and 7. FIG. 8 illustrates the case when frontier F is not a subset of EXC. In FIG. 8, a rectangle labeled "S" represents the set of states of a design under verification. A rectangle labeled "C" is a subset of S and represents the set of states satisfying the constraints. A rectangle labeled "RM" represents the set of all reachable states from I. A cross-hatched rectangle labeled "I" represents the set I and indicates a set of states within set S that are the initial states. A rectangle labeled "I∩C" is the set of initial states I that satisfy, or are within, C. A portion within the bold line labeled RC is determined as discussed above in steps 82, 84 and 86. The dots represent several states and the curved arrows between the dots represent one step transitions. Note that the set shapes in FIG. 8 are for illustration purposes only and are not intended to reflect any property of the sets.

In FIG. 8, a state labeled S3 is a dead-end state because every transition from S3 goes out of set C. Therefore, the model is not checkable because there is not a transition from S3 that stays within C. If there was at least one transition to a state within C, the model could be checkable. For the example of FIG. 8, at step 88 of FIG. 7, a report would be generated showing a sequence of states entirely inside of C, where the first state of the sequence is within the initial set I∩C and the last state is a state, such as S3, that cannot transition to a state inside of C.

Referring back to step 86 of FIG. 7, if frontier F is a subset of EXC, the YES path is taken back to step 82. Steps 82, 84 and 86 are repeated until there are no new states, or a state is reached that only transitions to states outside of C. When there are no new states and all reached states can transition within C, the YES path is taken from decision step 82 to step 78 of FIG. 6.

Figure 9:
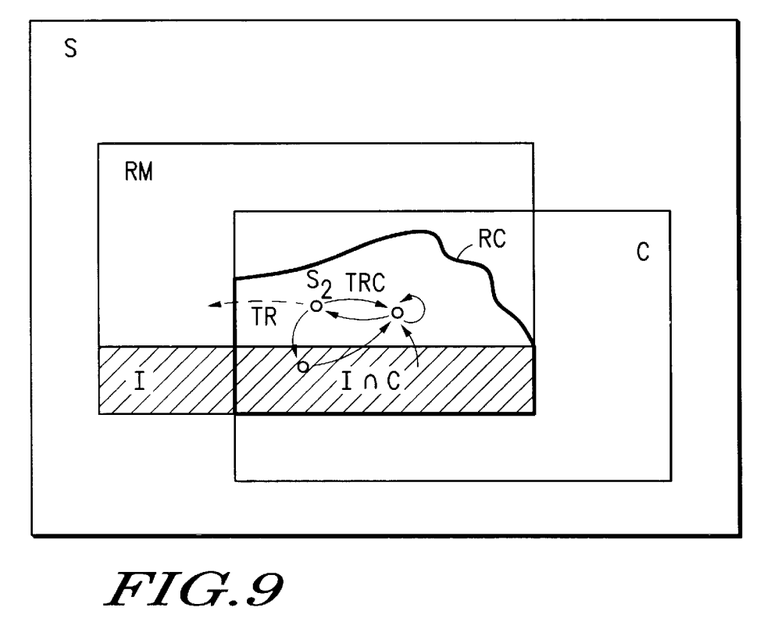
FIG. 9 illustrates, in partial Venn diagram form and partial state diagram form, a model checkable model in accordance with the method of FIGS. 6 and 7.

FIG. 9 illustrates, in partial Venn diagram form and partial state diagram form, a model checkable model in accordance with the method of FIGS. 6 and 7. In FIG. 9, a rectangle labeled "S" represents the set of states of a design under verification. A rectangle labeled "C" represents a subset of set S that satisfies the constraints. A rectangle labeled "RM" represents the set of all reachable states from I. A crosshatched rectangle labeled "I" represents the set I and indicates a set of states within set S that are the initial states. A rectangle labeled "I∩C" is the set of initial states I that satisfy, or are within, C. A portion within the bold line labeled RC is the set of states beginning at I and staying within set C, and is determined as discussed above in steps 82, 84 and 86. The dots represent several states and the curved arrows between the dots represent transitions between the states. Note that the set shapes in FIG. 9 are for illustration purposes only and are not intended to reflect any property of the sets.

FIG. 9 is used to illustrate that a checkable model may have a state, such as for example, state S2 that includes a transition represented by the dashed line that is outside of set C, as long as there is at least one transition that stays within C.

As discussed above, FIGS. 3 and 6 illustrate a method for model checking using constraints. By using the methods illustrated in FIG. 3 and FIG. 6 the need to construct an environment to provide inputs to a design under analysis is eliminated.

Figure 10:
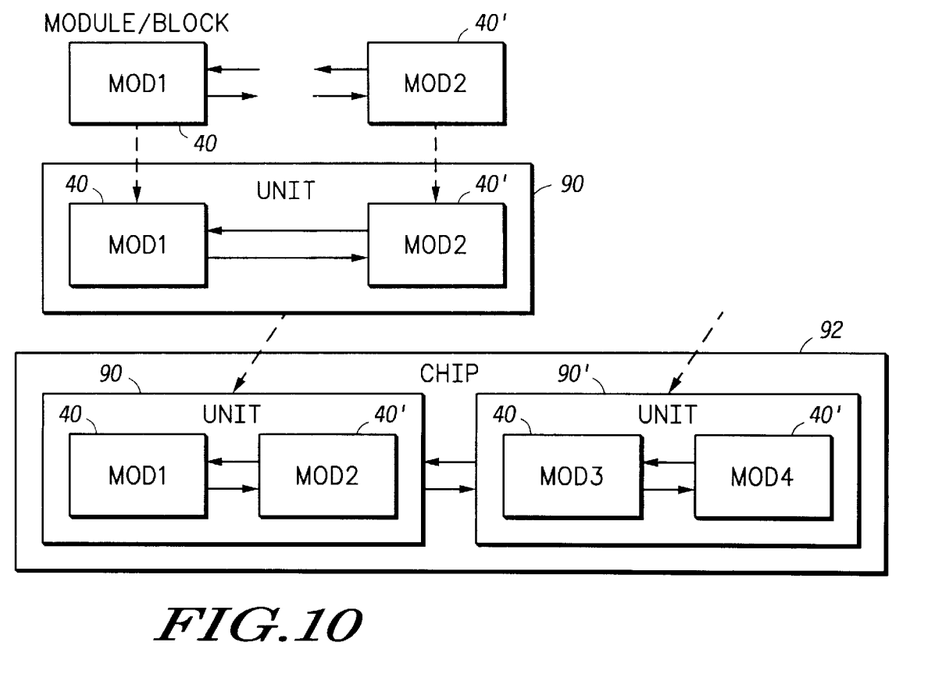
FIG. 10 illustrates, in block diagram form, an example of how constraints can be used with assume/guarantee reasoning.

FIG. 10 illustrates, in block diagram form, an example of how constraints can be used with assume/guarantee reasoning in integrated circuit design. Module 40, labeled "MOD1", is a design under verification. Module 40 may be a portion of an integrated circuit, and is checked under the assumption of constraints as discussed above. Temporal properties are proved assuming the constraints and a module 40', labeled "MOD2" is checked assuming constraints to verify temporal properties of MOD2. Note that the verification of module 40 and module 40' is conducted separately.

After modules 40 and 40' are verified, it may be advantageous to combine them into a larger unit level module such as unit 90. In unit 90 the constraints used above to check modules 40 and 40' become temporal properties to be verified about unit 90. If the constraints of module 40 and module 40' are verified in unit 90, then the properties of modules 40 and 40' independently are guaranteed to hold true for unit 90. Likewise, the same reasoning would hold true for the model checking of a chip 92. Chip 92 is an integrated circuit that may have a plurality of modules. In chip 92, if the constraints of units 90 and 90' verified in chip 92, then the properties of units 90 and 90' are independently guaranteed to hold true for chip 92.

In the event that the unit level model is too complex to model check, the constraints (assumptions) from the block level model can be used as properties (guarantees) to monitor during simulation of the integrated circuit design. If the unit level properties are violated during simulation, it would then be known that the constraints under which block level designs were verified, were violated, and hence the block level properties may not hold. Also, constraints can be used as a simple, relatively easily understood and communicated method to document assumptions about interfaces between parts of a design. Constraints can be used with simulation and model checking to validate these assumptions about the interfaces.

The methods and implementing apparatus of the present invention have been described in connection with the preferred embodiments as disclosed herein. Although exemplary embodiments of the present invention have been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method of model checking a finite state system, the method comprising the steps of:

identifying from the finite state system states S, a transition relation TR, and initial states I;

determining a set C, wherein set C is a subset of set S that satisfies a finite state system constraint; and creating a new finite state system having states C, wherein the finite state system constraint is included as a property within the new finite state system for model checking the finite state system.

2. The method of claim 1 further comprising the step of:

determining a transition relation TRC, wherein the transition relation TRC includes members of TR whose coordinates lie within set C; and the step of creating a new model includes the new model having the set C and the transition relation TRC.

3. The method of claim 1 further comprising the step of:

determining a new set of initial states I∩C that includes members of I that lie within C, wherein ∩ represents an operation of set intersection; and the step of creating a new model includes the new model having the set C and the initial states I∩C.

4. The method of claim 1 further comprising the steps of:

determining a set EXC, wherein a state of set S belongs to EXC if and only if there exists a state that satisfies C and is reachable from set S via the transition relation TR in one step;

determining if set C is contained within EXC; and reporting an error condition when set C is not contained within EXC.

5. The method of claim 1 further comprising the steps of:

determining a set EXC, wherein the set EXC is a subset of set S and each member of set EXC can reach a member of set C in one time step using the transition relation TR;

determining a new set of initial states I∩C that includes members of I that lie within C;

determining a transition relation TRC, wherein the transition relation TRC includes members of TR whose coordinates lie within C;

determining if C is contained within EXC;

reporting an error condition when C is not contained within EXC; and the step of creating a new model includes the new model having states within set C, the transition relation TRC, and initial states I∩C.

6. The method of claim 5, further comprising the step of generating an error report if the new set of initial states I∩C is empty.

7. The method of claim 5 further comprising the step of model checking the new model to determine if the new model meets a predefined specification.

8. The method of claim 5, wherein the constraints used to create the new model are used as properties which are monitored during simulation of an integrated circuit design.

9. The method of claim 5, wherein the finite state system constraint is a Boolean valued expression.

10. The method of claim 9, wherein the finite state system constraint involves signals from a monitor portion of the finite state system and the monitor portion of the finite state system is present for a purpose of verifying the system.

11. The method of claim 9, wherein the finite state system represents an electronic circuit model, and the system constraint references values of inputs, outputs, wires, nets, registers, parameters or other elements of the electronic circuit model.

12. The method of claim 11, wherein the electronic circuit model is a semiconductor circuit model.

13. A method of model checking a design file, the method comprising the steps of:

extracting a model having states S, a transition relation TR, and initial states I;

determining a set C, wherein set C is a subset of set S that satisfies a design constraint;

determining a set EXC, wherein a state of set S belongs to EXC if and only if there exists a state that satisfies C and is reachable from set S via the transition relation TR in one step;

determining a new set of initial states (I∩C);

determining a transition relation TRC, wherein the transition relation TRC consists of members of TR whose coordinates lie within C;

determining a set RC, wherein RC is a set of states in C that are reachable from (I∩C) using the transition relation TRC; and creating a new model having states RC, the transition relation TRC, and initial states (I∩C), wherein the design constraint is included as a property within the new model for model checking the design file.

14. The method of claim 13, wherein the step of determining the set RC further comprises the substeps of:

defining the set RC to be equal to empty set;

defining a frontier set (F) to be equal to (I∩C);

until F is equal to the empty set or F is not contained within EXC, repeating the following steps:

defining RC to be RC union F;

defining F=(image(TRC, RC)∩C)−RC, wherein image (TRC, RC) represents a set of states in S that are reachable in one time step from RC using the transition relation TRC, ∩ represents an operation of set intersection, and − represents an operation of set difference;

determining if F is contained within EXC; and reporting an error condition when F is not contained within EXC.

15. The method of claim 13, wherein:

the step of determining the set RC further comprises the substeps of:

defining the set RC to be equal to an empty set;

defining a frontier set (F) to be equal to (I∩C);

until F is equal to the empty set or F is not contained within EXC, repeating the following steps:

defining RC to be a union of RC and F;

defining F=image(TRC, RC)−RC, wherein image (TRC, RC) represents a set of states in S that are reachable in one step from RC using the transition relation TRC, and − represents an operation of set difference;

determining if F is contained within EXC; and reporting an error condition when F is not contained within EXC.

16. The method of claim 13, wherein the constraints used to create the new model are used as properties which are monitored during simulation of an integrated circuit design.

* * * * *